(12) United States Patent
Okuyama

(10) Patent No.: US 11,410,710 B2
(45) Date of Patent: Aug. 9, 2022

(54) SEMICONDUCTOR MEMORY DEVICE

(71) Applicant: Kioxia Corporation, Tokyo (JP)

(72) Inventor: Kiyoshi Okuyama, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/205,631

(22) Filed: Mar. 18, 2021

(65) Prior Publication Data

US 2021/0295878 A1 Sep. 23, 2021

(30) Foreign Application Priority Data

Mar. 23, 2020 (JP) .............................. JP2020-051491

(51) Int. Cl.
| | | |
|---|---|---|
| *G11C 5/06* | (2006.01) | |
| *H01L 23/528* | (2006.01) | |
| *H01L 27/11582* | (2017.01) | |
| *H01L 27/11556* | (2017.01) | |
| *G11C 8/12* | (2006.01) | |

(52) U.S. Cl.
CPC .............. *G11C 5/06* (2013.01); *H01L 23/528* (2013.01); *H01L 27/11556* (2013.01); *H01L 27/11582* (2013.01); *G11C 8/12* (2013.01)

(58) Field of Classification Search
None
See application file for complete search history.

(56) References Cited

U.S. PATENT DOCUMENTS

| 8,228,724 B2* | 7/2012 | Takemura | ........... H01L 27/2463 365/158 |
|---|---|---|---|
| 2016/0268304 A1 | 9/2016 | Ikeda | |
| 2020/0126622 A1 | 4/2020 | Utsumi | |
| 2021/0066316 A1* | 3/2021 | Ota | ................... H01L 27/11556 |

FOREIGN PATENT DOCUMENTS

| JP | 2016-171243 A | 9/2016 |
|---|---|---|
| JP | 2020-065022 A | 4/2020 |

\* cited by examiner

*Primary Examiner* — Tan T. Nguyen
(74) *Attorney, Agent, or Firm* — Foley & Lardner LLP

(57) ABSTRACT

A semiconductor memory device includes a substrate; a first impurity region of a first conductive type; a second impurity region of the first conductivity type apart from the first impurity region in a first direction; a first transistor including a first electrode disposed between the first impurity region and the second impurity region; a third impurity region of the first conductive type apart from the first impurity region in a second direction that crosses the first direction; a fourth impurity region of the first conductive type apart from the third impurity region in the first direction; a second transistor including a second electrode disposed between the third impurity region and the fourth impurity region. The semiconductor memory device includes an active region of the first conductive type between the first transistor and the second transistor.

13 Claims, 9 Drawing Sheets

SEMICONDUCTOR MEMORY DEVICE

CROSS-REFERENCE TO RELATED APPLICATION

This application is based upon and claims the benefit of priority from Japanese Patent Application No. 2020-051491, filed Mar. 23, 2020; the entire contents of which are incorporated herein by reference.

FIELD

Embodiments described herein relate generally to a semiconductor memory device.

BACKGROUND

A semiconductor memory device includes a plurality of memory blocks and a block selection circuit configured to select and operate a memory block in the plurality of memory blocks. Each memory block includes a plurality of memory cells. In block selection circuit, in some cases, between adjacent transistor array regions which are different in operation timings or applied voltages, a high potential difference may be caused, which will result in withstand-voltage breakdown.

DETAILED DESCRIPTION

A semiconductor memory device may include, but is not limited to, includes a substrate; a first impurity region of a first conductive type; a second impurity region of the first conductivity type apart from the first impurity region in a first direction; a first transistor including a first electrode disposed between the first impurity region and the second impurity region; a third impurity region of the first conductive type apart from the first impurity region in a second direction that crosses the first direction; a fourth impurity region of the first conductive type apart from the third impurity region in the first direction; a second transistor including a second electrode disposed between the third impurity region and the fourth impurity region. The semiconductor memory device includes an active region of the first conductive type between the first transistor and the second transistor.

Semiconductor memory devices in some embodiments will be described below with reference to the drawings. In the descriptions, same signs or reference numbers refer to one or more elements having the same or similar functions. Duplicate descriptions will be omitted to avoid redundancy. In the descriptions, the term "parallel" includes not only just-parallel, but also generally-parallel and anti-parallel, The term "orthogonal" includes not only just-orthogonal, but also generally-orthogonal. The term "connection" includes not only a direct connection between two elements without any intervention, but also an indirect connection between two elements through any intervention.

Embodiments (Overall Configurations)

Semiconductor memory devices according to some embodiments will be described below with reference to the drawings. The following drawings are schematic drawings and some configurations may be omitted for the sake of convenience of explanation in some cases.

Figure 1:
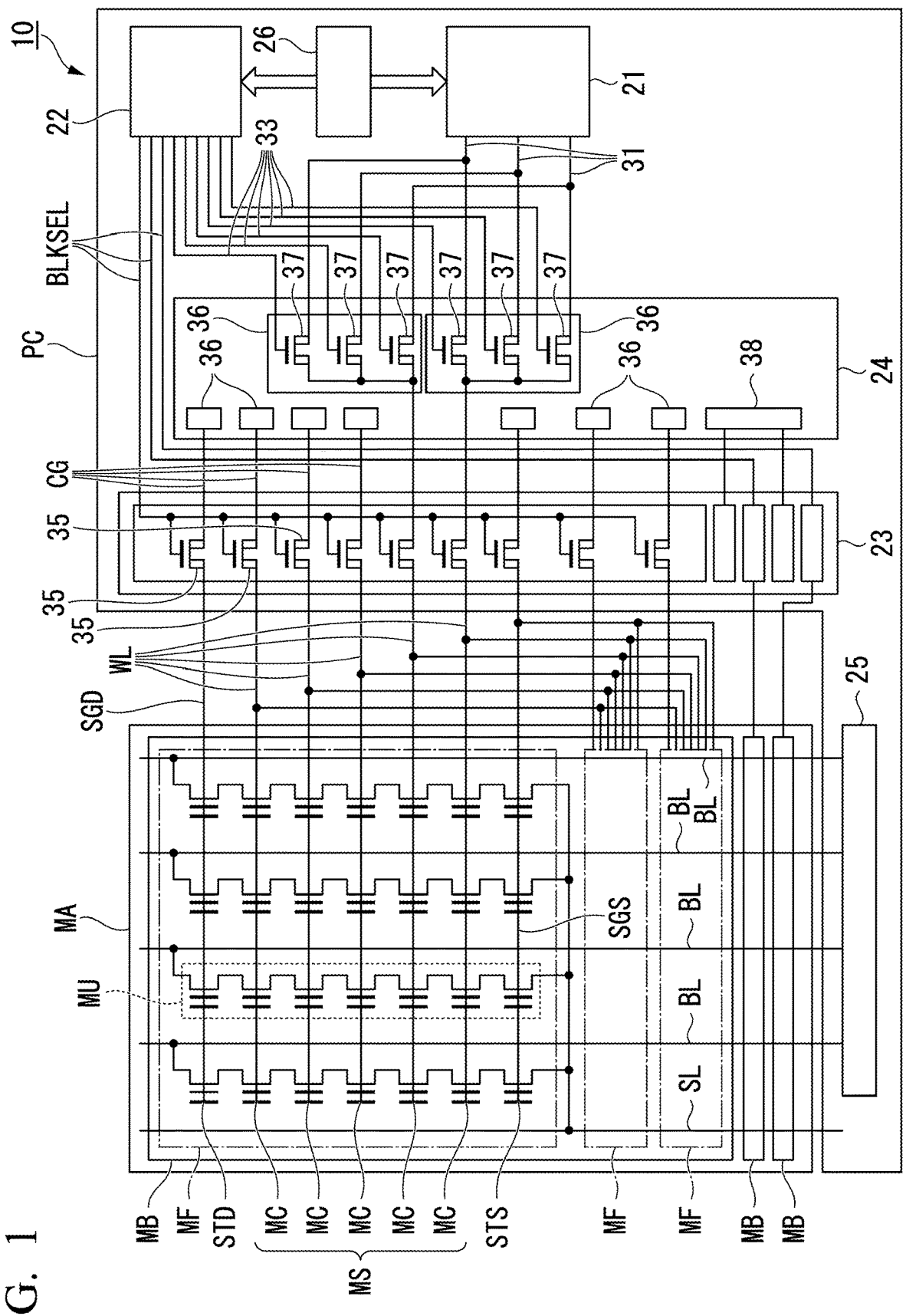
FIG. 1 is an equivalent circuit diagram showing a schematic structure of a semiconductor memory device according to an embodiment.

FIG. 1 is a schematic equivalent circuit diagram showing a structure of a semiconductor memory device 10 according to the first embodiment.

A semiconductor memory device 10 includes a memory cell array MA and a peripheral circuit PC configured to control the memory cell array MA.

The memory cell array MA includes a plurality of memory blocks MB. Each memory block MB includes a plurality of memory fingers MF. Each memory finger MF includes a plurality of memory units MU. Each memory unit MU is connected to a bit line BL which is connected to the peripheral circuit PC and also connected to a common source line SL which is connected to the peripheral circuit PC.

Each memory unit MU includes a series connection of a drain selection transistor STD, a memory string MS, and a source selection transistor STS, between the bit line BL and the source line SL. Hereinafter, the drain selection transistor STD and the source selection transistor STS may be simply referred to as "selection transistors (STD and STS)" in some cases.

The memory string MS in each memory unit MU includes a series connection of a plurality of memory cells MC between the drain selection transistor STD and the source selection transistor STS. Each memory cell MC according to some embodiments may include a field effect transistor. The field effect transistor includes a gate insulation film which includes a charge accumulation film. A threshold voltage of the memory cell MC will depend on an amount of electric charges in the charge accumulation film. In each memory string MS, gate electrodes of the plurality of memory cells MC are connected to word lines WL. Each word line WL is connected to gate electrodes of respective memory cells MC in the memory strings MSs.

The selection transistors (STD and STS) are field effect transistors. Selection gate lines (SGD and SGS) are connected to gate electrodes of the selection transistors (STD and STS). Each memory finger MF further includes a respective drain selection line SGD and a respective source selection line SGS which are commonly connected to all of the memory units MU in that memory finger MF.

The peripheral circuit PC includes an operation voltage generation circuit 21 configured to generate operation voltages. The peripheral circuit PC also includes address decoders 22 configured to decode address data. The peripheral circuit PC also includes block selection circuits 23. The peripheral circuit PC also includes a voltage selection circuit (hereinafter referred to as a "control circuit") 24 configured to transfer an operation voltage to the memory cell array MA in accordance with an output signal from each of the address decoders 22. The peripheral circuit PC also includes sense amplifiers 25 connected to the bit line BL. The peripheral circuit PC also includes a sequencer 26 configured to generate control signals. The control circuit 24 includes a plurality of first voltage selectors 36 and a second voltage selector 38 that are connected to the block selection circuits 23. The plurality of first voltage selectors 36 and the second voltage selector 38 are electrically isolated from each other.

The operation voltage generation circuit 21 includes a plurality of operation voltage output terminals 31. The operation voltage generation circuit 21 may, for example, include a step-down circuit and a step-up circuit such as a charge pump circuit. For example, for performing a read operation, a write operation, or an erase operation on the memory cell array MA, in accordance with a control signal from the sequencer 26, the operation voltage generation circuit 21 generates a plurality of operation voltages applied to the bit line BL, the source line SL, the word lines WL, and the selection gate lines (SGD and SGS), and applies the plurality of operation voltages to the plurality of operation voltage output terminals 31 at the same time. The operation voltage on each operation voltage output terminal 31 is appropriately adjusted in accordance with the control signal from the sequencer 26.

For a read operation, the operation voltage generation circuit 21 generates a read voltage and a read path voltage as operation voltages. The read voltage is a voltage used for determining data stored in the selected memory cell MC. When the read voltage is applied to one of the word lines WL, a part, but not all, of the plurality of memory cells MC connected to the read-voltage-applied one of the word lines WL will turn ON and the remaining memory cells MC of the plurality of memory cells MC connected to the read-voltage-applied one of the word lines WL will be in OFF. The read path voltage is higher in voltage than the read voltage. The read path voltage will place all the memory cells MC into ON-state. When the read path voltage is applied to one of the word lines WL, all memory cells MC connected to the read path-voltage-applied-one of the word lines WL will turn ON-state.

For a write operation, the operation voltage generation circuit 21 generates a writing path voltage and a program voltage as operation voltages. The writing path voltage is equal to or higher than the read voltage. The writing path voltage will place all memory cells MC into ON-state. When the writing path voltage is applied to one of the word lines WL, all memory cells MC connected to the writing-path-voltage-applied-one of the word lines WL are all turned ON. The program voltage is higher than the writing path voltage. The program voltage is for accumulating electric charges in the charge accumulation film of each of the memory cells MC. When the writing path voltage is applied to one of the word lines WL, electrons are accumulated in some of the charge accumulation films of the plurality of memory cells MC.

The address decoder 22 includes a plurality of block selection lines BLKSEL and a plurality of voltage selection lines 33. For example, the address decoder 22 sequentially refers to address data of an address register in accordance with a control signal from the sequencer 26, decodes the address data, turns on prescribed block selection transistor 35 and voltage selection transistor 37 corresponding to the address data, and turns off block selection transistors 35 and voltage selection transistors 37 other than the prescribed block selection transistor 35 and voltage selection transistor 37. For example, the voltage of the prescribed block selection lines BLKSEL and the voltage selection lines 33 is set to an "H" state and the other voltages are set to an "L" state. When a P-channel type transistor is used instead of an N-channel type transistor, the voltage of the prescribed block selection lines BLKSEL and the voltage selection lines 33 is set to an "L" state and the other voltages are set to an "H" state.

In the shown example, in the address decoder 22, one of the block selection lines BLKSEL is provided for each of the memory blocks MB. However, this structure can be changed as appropriate. For example, one block selection line BLKSEL may be provided for each of two or more memory blocks MB.

Each of the block selection circuit 23 includes a plurality of block selectors 34 corresponding to the memory blocks MB. Each of the plurality of block selectors 34 includes a plurality of block selection transistors 35 corresponding to the word lines WL and the selection gate lines (SGD and SGS). Each of the block selection transistors 35 is, for example, a field effect type withstand-voltage transistor. Drain electrodes of the block selection transistors 35 are electrically connected to the corresponding word lines WL or selection gate lines (SGD and SGS), respectively. Source electrodes are electrically connected to the operation voltage output terminals 31 via wirings CG and the voltage selection circuit 24. Gate electrodes are commonly connected to the corresponding block selection lines BLKSEL.

In the shown example, in the block selection circuit 23, one of the block selection transistors 35 is provided for each of the word lines WL and one of the block selection transistors 35 is provided for each of the selection gate lines (SGD and SGS). However, this structure can be changed as appropriate. For example, two of the block selection transistors 35 may be provided for each of the selection gate lines (SGD and SGS).

The voltage selection circuit 24 includes a plurality of first voltage selectors 36 corresponding to the word lines WL and the selection gate lines (SGD and SGS). Each of the plurality of first voltage selectors 36 includes a plurality of voltage selection transistors 37. The voltage selection transistors 37 are, for example, field effect type withstand voltage transistors. Each of drain terminals of the voltage selection transistors 37 is electrically connected to the corresponding word lines WL or selection gate lines (SGD and SGS) via the wirings CG and the block selection circuit 23. Each of source terminals is electrically connected to the corresponding operation voltage output terminal 31. Each of gate electrodes is connected to the corresponding voltage selection line 33.

Each of the sense amplifiers 25 is connected to the plurality of bit lines BL. The sense amplifier 25 includes, for example, a plurality of sense amplifier units corresponding to the bit lines BL. Each of the sense amplifier units includes a clamp transistor configured to charge each of the bit lines BL on the basis of a voltage generated in the operation voltage generation circuit 21, a sense circuit configured to sense a voltage or a current of the bit line BL, a plurality of latches configured to hold an output signal, write data, verify a path flag, and the like of the sense circuit, and a logic circuit. For example, the logic circuit specifically identifies data stored in each of the memory cells MC with reference to data on a lower-ordered page held in each of the latches during a read operation. Furthermore, for example, a voltage of each of the bit lines BL is controlled with reference to data on a lower-ordered page held in each of the latches during a write operation.

The sequencer 26 outputs a control signal to the operation voltage generation circuit 21, the address decoder 22, and the sense amplifier 25 in accordance with an input command and a state of the semiconductor memory device. For example, the sequencer 26 sequentially refers to command data of a command register in accordance with a clock signal, decodes the command data, and outputs the decoded command data to the operation voltage generation circuit 21, the address decoder 22, and the sense amplifier 25.

Figure 2:
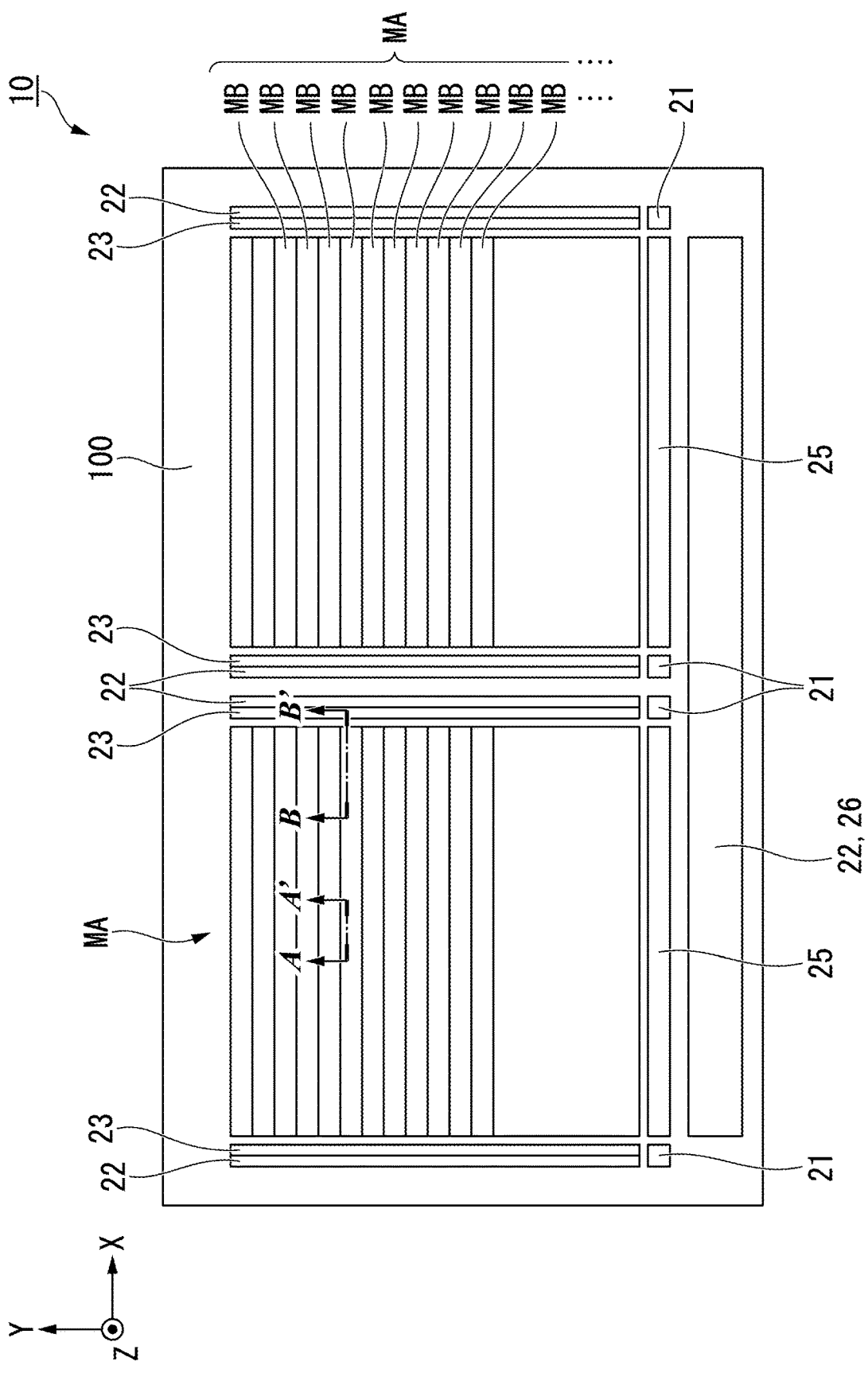
FIG. 2 is a schematic plan view showing the semiconductor memory device.

A structure of the semiconductor memory device 10 according to this embodiment will be described below with reference to FIG. 2. FIG. 2 is a schematic plan view showing the semiconductor memory device 10 according to this embodiment. FIG. 2 shows a schematic structure and a specific structure can be changed as appropriate. Furthermore, in FIG. 2, some constituent elements will be omitted.

As shown in FIG. 2, the semiconductor memory device 10 according to this embodiment includes a semiconductor substrate 100. In the shown example, two memory cell arrays MA arranged in an X direction are provided on the semiconductor substrate 100. Furthermore, the block selection circuits 23 and the address decoders 22 are provided in regions of the memory cell arrays MA extending in a Y direction along both end portions of the memory cell arrays MA in the X direction so that the block selection circuits 23 are closer to the memory cell arrays MA than the address decoders 22 are. In addition, each of the sense amplifiers 25 is provided in a region extending in the X direction along an end portion of each of the memory cell arrays MA in the Y direction. The operation voltage generation circuit 21 are provided in a region near both end portions of the region having the sense amplifier 25 provided therein in the X direction. Furthermore, the sequencer 26 is provided in a region outside these regions.

(Memory Cell Array MA)

Figure 3A:
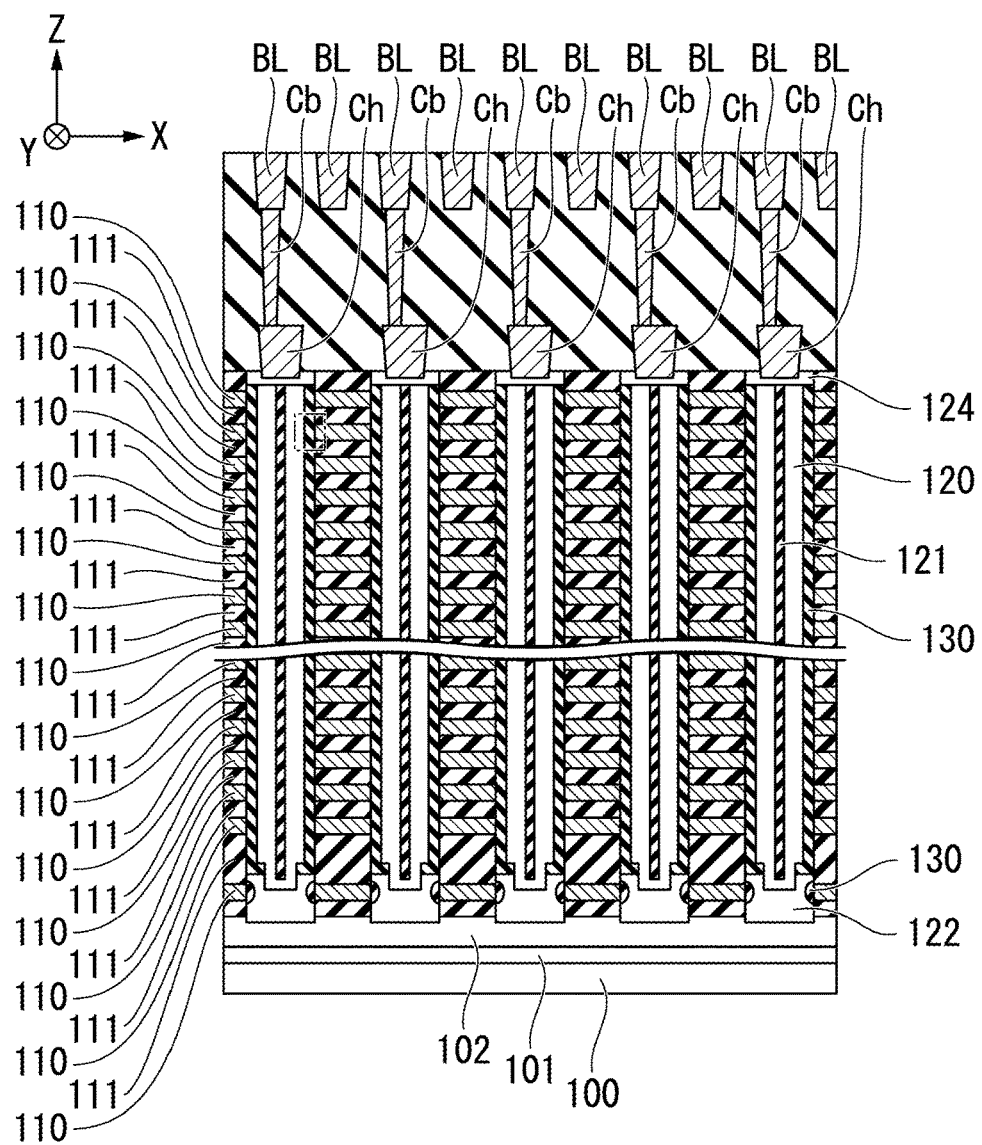
FIG. 3A is a schematic cross-sectional view showing a structure shown in FIG. 2 of the semiconductor memory device taken along line A-A' when viewed in a direction of an arrow.
Figure 3B:
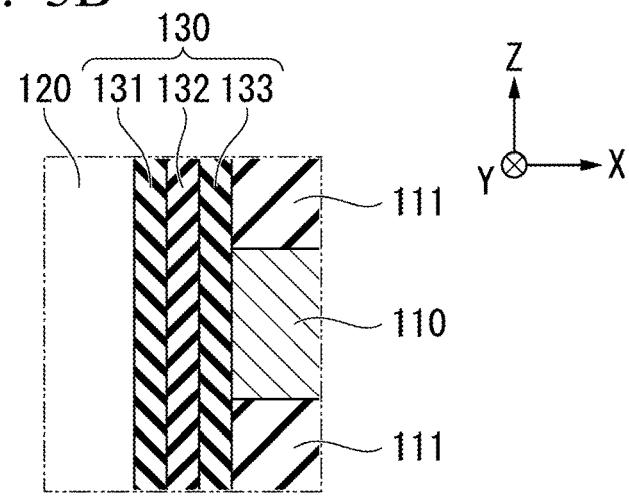
FIG. 3B is a partially enlarged diagram of a cross section of the semiconductor memory device shown in FIG. 3A.
Figure 4:
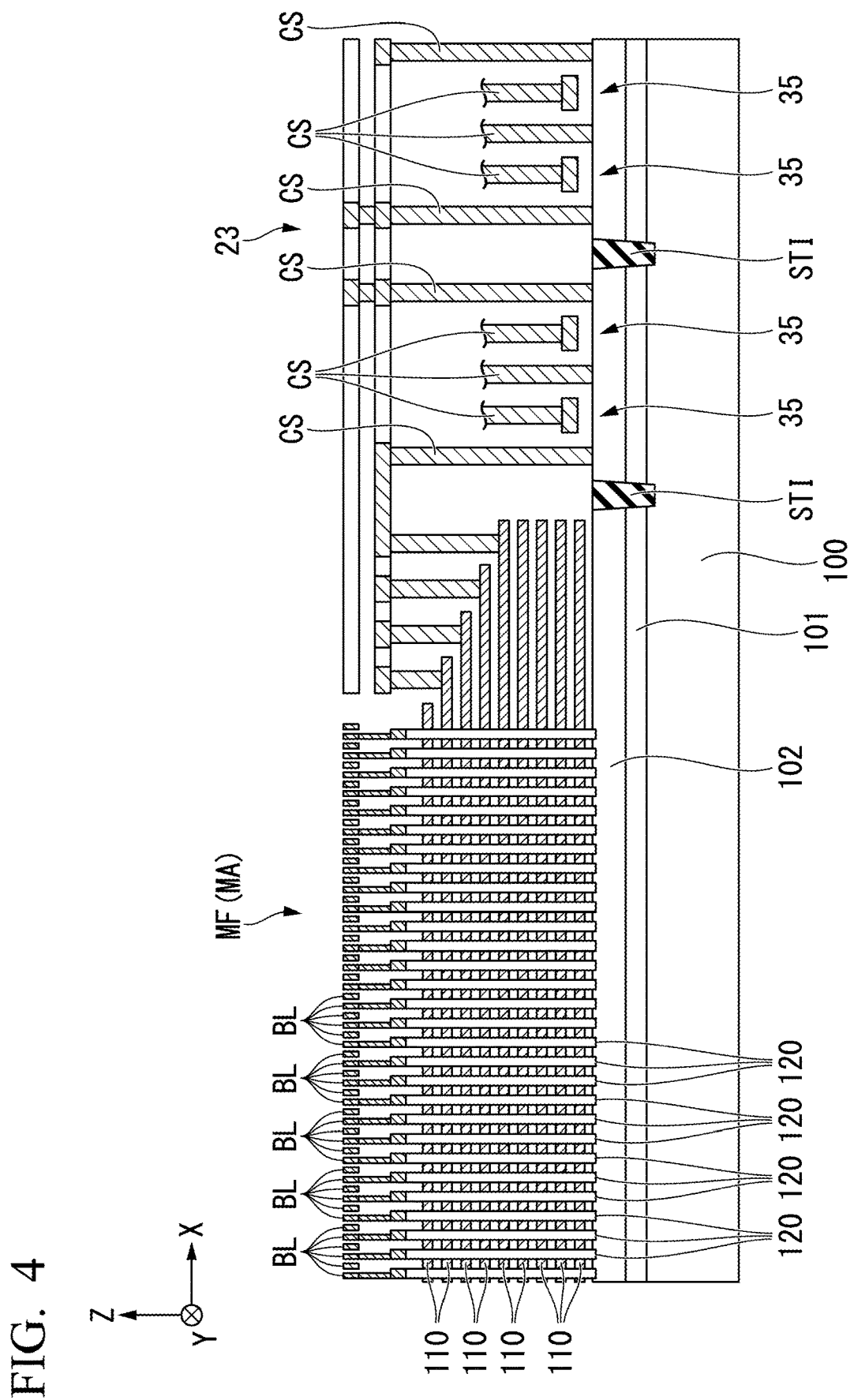
FIG. 4 is a schematic cross-sectional view showing the structure shown in FIG. 2 of the semiconductor memory device taken along line B-B' when viewed in the direction of the arrow.

A structure of each of the memory cell arrays MA will be described below with reference to FIGS. 2 to 4. FIG. 3A is a schematic cross-sectional view showing the semiconductor memory device 10 shown in FIG. 2 taken along line A-A when viewed in a direction of an arrow. FIG. 3B is a partial enlarged diagram of a cross section of the semiconductor memory device shown in FIG. 3A. FIG. 4 is a schematic cross-sectional view showing the semiconductor memory device 10 shown in FIG. 2 taken along line B-B' when viewed in a direction of an arrow. FIGS. 2 to 4 show schematic structures and specific structures can be changed as appropriate. Moreover, in FIGS. 2 to 4, some constituents are omitted.

As shown in FIG. 2, the memory cell array MA includes the plurality of memory blocks MB arranged in the Y direction. Each of the memory blocks MB includes a plurality of memory trenches (not shown), a plurality of the semiconductor columns 120, a plurality of selection gate lines SGD, SGS, and a plurality of word lines WL. The plurality of memory trenches are arranged at predetermined intervals in the Y direction. Each of the memory trenches is an insulation region and includes, for example, a silicon oxide layer. The word lines WL are provided between memory trenches adjacent to each other in the Y direction. The word lines WL adjacent to each other in the Y direction are separated using the memory trenches.

As shown in FIG. 3, the memory block MB includes a plurality of conductive layers 110 on the semiconductor substrate 100, the plurality of the semiconductor columns 120, and a plurality of gate insulation films 130 provided between the plurality of conductive layers 110 and the plurality of the semiconductor columns 120.

The semiconductor substrate 100 is, for example, a semiconductor substrate such as single crystal silicon (Si) containing P-type impurities. An N-type well 101 containing N-type impurities such as phosphorus (P) is provided on a part of a surface of the semiconductor substrate 100. Furthermore, a P-type well 102 containing P-type impurities such as boron (B) is provided on a part of a surface of the N-type well 101. In addition, insulation regions STI (FIG. 4) such as $SiO_2$ are provided on a part of the surface of the semiconductor substrate 100. Hereinafter, a region of the surface of the semiconductor substrate 100 in which the insulation regions STI are not provided is referred to as a "semiconductor region" in some cases.

A plurality of conductive layers 110 are substantially plate-shaped conductive layers extending in the X direction and arranged in a Z direction. Each of the conductive layers 110 may contain, for example, a stacked layer or the like formed of titanium nitride (TiN) and tungsten (W) or may contain polycrystalline silicon or the like containing impurities such as phosphorus and boron. Furthermore, an insulation layer 111 such as silicon oxide ($SiO_2$) is provided between the conductive layers 110.

Among the plurality of conductive layers 110, one or more conductive layers 110 located at the lowest layer function as gate electrodes for the source selection line SGS (FIG. 1) and the plurality of source selection transistors STS connected to the source selection line SGS. Furthermore, a plurality of conductive layers 110 located above the one or more conductive layers 110 functions as gate electrodes for the word lines WL (FIG. 1) and the plurality of memory cells MC (FIG. 1) connected to the word lines WL. In addition, one or more conductive layers 110 located above the plurality of conductive layers 110 function as gate electrodes for the drain selection line SGD and the plurality of drain selection transistor STD (FIG. 1) connected to the drain selection line SGD.

The plurality of semiconductor columns 120 are arranged in the X direction and the Y direction. Each of the semiconductor columns 120 is, for example, a semiconductor film formed of non-doped polycrystalline silicon (Si). As shown in FIG. 3A, the semiconductor column 120 has, for example, a substantially cylindrical shape and includes an insulation film 121 such as silicon oxide provided in a central portion thereof. Furthermore, an outer circumferential surface of each of the semiconductor columns 120 is surrounded by each of the conductive layers 110. A lower end portion of each of the semiconductor columns 120 is connected to the P-type well 102 of the semiconductor substrate 100 via a semiconductor layer 122 such as non-doped single crystal silicon. The semiconductor layer 122 faces the conductive layers 110 via an insulation layer 123 such as silicon oxide. Upper end portions of the semiconductor columns 120 are connected to the bit lines BL via a semiconductor layer 124 containing N-type impurities such as phosphorus (P) and contacts Ch and Cb. Each of the semiconductor columns 120 functions as a channel region for the plurality of memory cells MC and the drain selection transistor STD included in one memory unit MU (FIG. 1). The semiconductor layer 122 functions as a channel region for the source selection transistor STS.

For example, as shown in FIG. 3B, each of the gate insulation films 130 includes a tunnel insulation film 131, a charge accumulation film 132, and a block insulation film 133 stacked between the semiconductor column 120 and the conductive layer 110. The tunnel insulation film 131 and the block insulation film 133 are, for example, insulation films such as silicon oxide. The charge accumulation film 132 is, for example, a film such as silicon nitride (SiN) having electric charges accumulated therein.

Although an example in which the gate insulation film 130 includes the charge accumulation film 132 such as silicon nitride has been described in FIG. 3B, the gate insulation film 130 may include, for example, a floating gate such as polycrystalline silicon containing N-type or P-type impurities.

(Block Selection Circuit 23)

Figure 5:
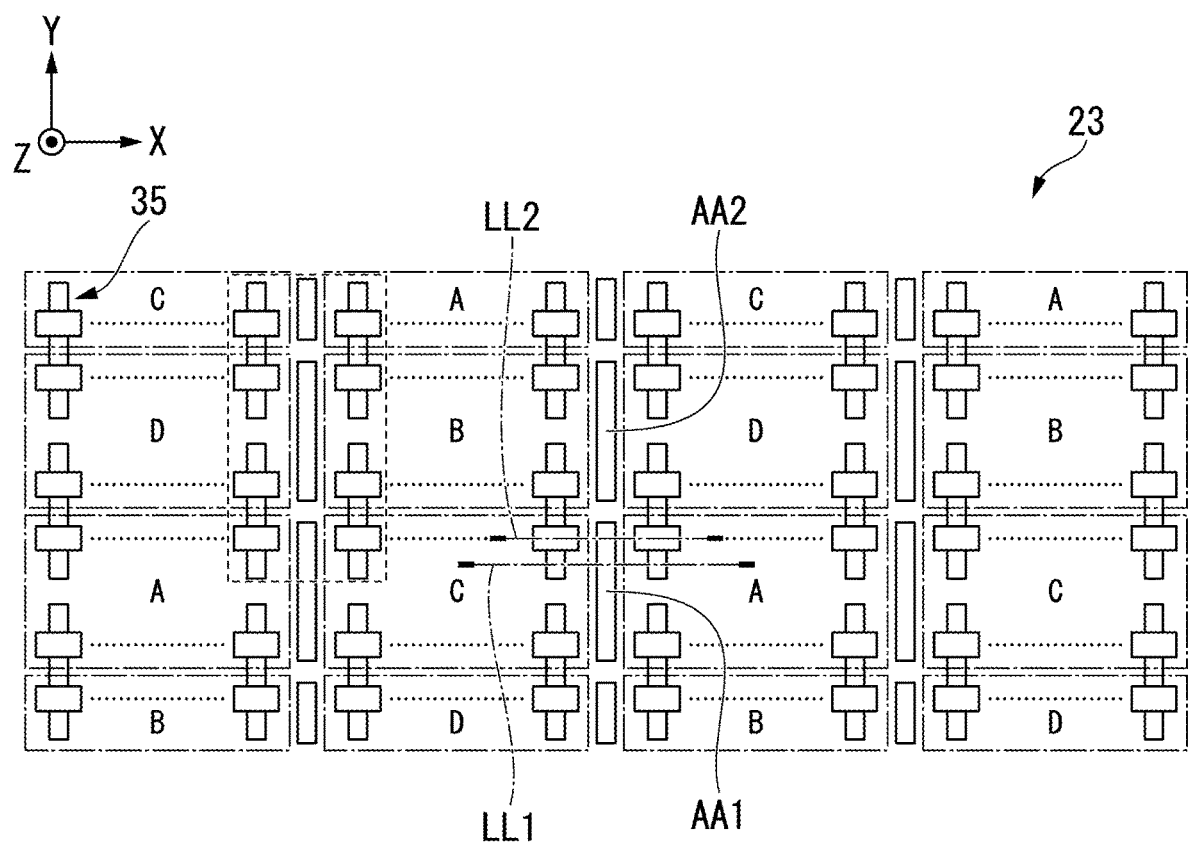
FIG. 5 is an equivalent circuit diagram showing a schematic structure of a block selection circuit constituting the semiconductor memory device of FIG. 1.

An example of a structure of the block selection circuit 23 according to this embodiment will be described below with reference to FIGS. 4 and 5. FIG. 4 is a schematic cross sectional view, taken along a B-B' line in FIG. 2, of the semiconductor device. FIG. 5 is a partial schematic enlarged diagram of the block selection circuit 23 constituting the semiconductor memory device of FIG. 2. FIGS. 4 and 5 show a schematic structure and a specific structure can be changed as appropriate. Furthermore, in FIG. 5, a partial structure will be omitted.

As shown in FIG. 4 and the like, in this embodiment, a plurality of transistors are provided on the surface of the semiconductor substrate 100. Some of these plurality of transistors function as, for example, the block selection transistors 35 (FIG. 1) constituting the block selection circuit 23.

FIG. 5 is an equivalent circuit diagram showing a schematic structure of the block selection circuit 23. The block selection circuit 23 includes a plurality of transistor array regions C, A, D, and B connected to four memory blocks operating at different timings (a first memory block $MB_C$, a second memory block $MB_A$, a third memory block $MB_D$, and a fourth memory block $MB_B$). Each of the transistor array regions A, B, C, and D includes an array of a plurality of selection MOS transistors 35. Here, the transistor array regions are all configured so that each of the transistor array regions is adjacent to the transistor array region connected to one of the other memory blocks in both of the X and Y directions. For example, the transistor array region A connected to the memory block $MB_A$ is configured not to be adjacent to the transistor array region A connected to another memory block $MB_A$.

Also, the block selection circuit 23 includes active regions AA1 and AA2 between the transistor array regions adjacent to each other in the X direction, specifically, between the transistor array region A and the transistor array region C and between the transistor array region B and the transistor array region D, respectively.

Figure 6A:
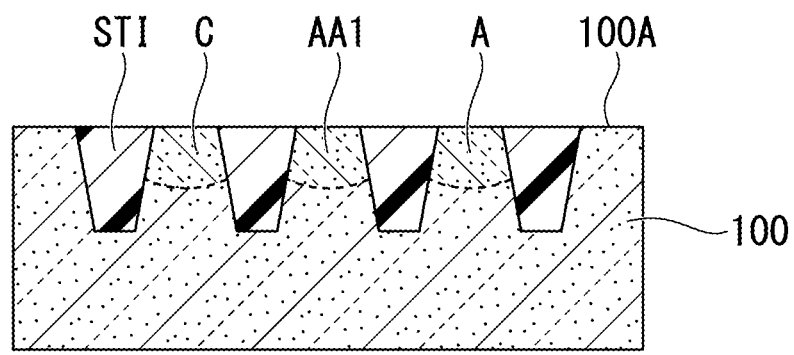
FIG. 6A is a cross-sectional view showing a schematic structure of a part of the block selection circuit of FIG. 5.
Figure 6B:
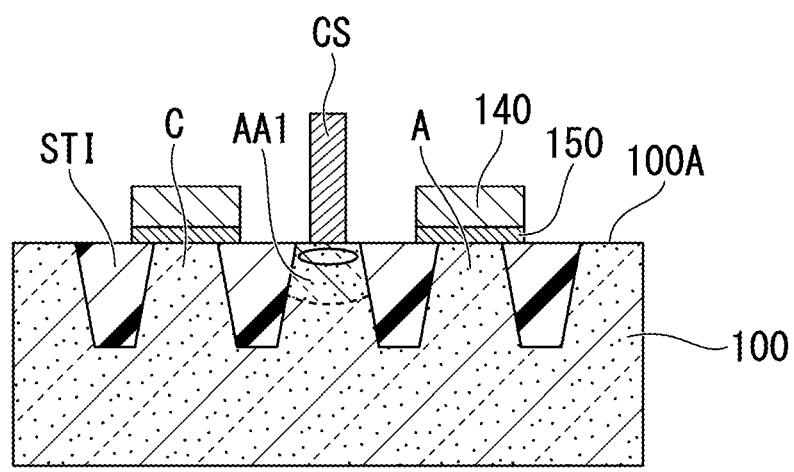
FIG. 6B is a cross-sectional view showing a schematic structure of a part of the block selection circuit of FIG. 5.

FIGS. 6A and 6B are cross-sectional views showing a partial schematic structure of the block selection circuit 23 of FIG. 5.

FIG. 6A is a cross-sectional view showing the block selection circuit 23 taken along line LL1. A case in which, on one main surface 100A side of a substrate 100, first impurities having a first conductive type (n-type or p-type) conductivity are injected into the transistor array region C, the active region AA1, and the transistor array region A will be described. Each of the insulation regions STI is between the transistor array region C and the active region AA1 and between the active region AA1 and the transistor array region A. The entire substrate 100 or a part (a well) surrounding each of the transistor array region C, the active region AA1, and the transistor array region A has a second conductive type conductivity opposite to the first conductive type.

FIG. 6B is a cross-sectional view showing the block selection circuit 23 taken along line LL2. A case in which, on one main surface 100A side of the substrate 100, the first impurities are injected into the active region AA1 will be exemplified. A contact (an electrode) CS is formed above the active region AA1 and a gate electrode 140 is formed above the transistor array region C and the transistor array region A to have a gate insulation film 150 arranged therebetween.

Figure 7A:
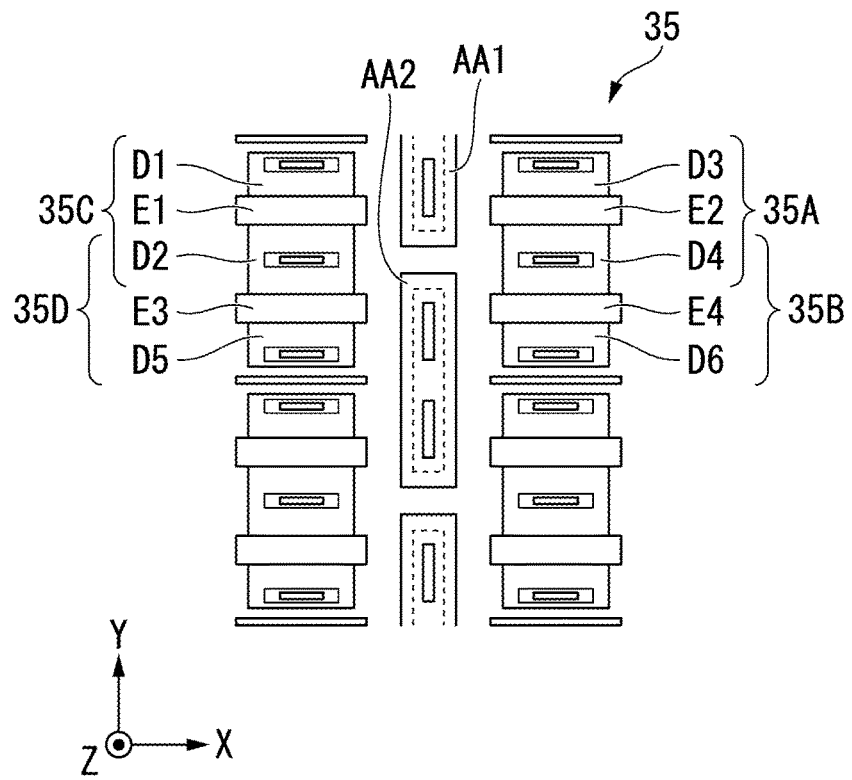
FIG. 7A is an enlarged diagram of an active region in the semiconductor memory device.

FIG. 7A is an enlarged diagram of the periphery of the partial active regions AA1 and AA2 (regions surrounded by broken lines) included in the block selection circuit 23 of FIG. 5. The active regions AA1 and AA2 are provided between two block selection transistors 35 (a first transistor 35C and a second transistor 35A). A concentration of first conductive-type impurities provided in the active regions AA1 and AA2 increases toward the surface of the substrate 100.

The first transistor 35C is on the substrate 100 and has a first impurity region D1 having a first conductive type, a second impurity region D2 on the substrate 100, located apart from the first impurity region D1 in a first direction (the Y direction), and having the first conductive type, and a first electrode E1 provided between the first impurity region D1 and the second impurity region D2 above the surface 100A of the substrate.

A second transistor 35A has a third impurity region D3 on the substrate 100, located apart from the first impurity region D1 in a second direction (the X direction) intersecting the first direction, and having the first conductive type, a fourth impurity region D4 on the substrate 100, located apart from the third impurity region D3 in the first direction, and having the first conductive type, and a second electrode E2 provided between the third impurity region D3 and the fourth impurity region D4 on the substrate 100A.

The second impurity region D2, the fourth impurity region D4, and the active regions AA1 and AA2 are electrically connected to a control circuit 24 (FIG. 1).

The first impurity region D1 is electrically connected to a wiring provided in a first memory block $MB_C$. The third impurity region D3 is electrically connected to a wiring provided in a second memory block $MB_A$. A fifth impurity region D5 is electrically connected to a wiring provided in a third memory block $MB_D$. A sixth impurity region D6 is electrically connected to a wiring provided in a fourth memory block $MB_B$.

The fifth impurity region D5 on the substrate 100, located apart from the second impurity region D2 in the first direction, and having the first conductive type and a third transistor 35D including a third electrode D3 provided between the second impurity region D2 and the fifth impurity region D5 on the substrate 100 are further provided.

The sixth impurity region D6 on the substrate 100, located apart from the fourth impurity region D4 in the first direction, and having the first conductive type and a fourth transistor 35B including a fourth electrode D4 provided between the fourth impurity region D4 and the sixth impurity region D6 on the substrate 100 are further provided.

In the active regions AA1 and AA2, the contact CS connected to the control circuit 24 shown in FIG. 1 is foil led on the surface of the semiconductor substrate 100. A portion of the surface of the semiconductor substrate 100 with which the contact CS is in contact and a portion near the contact portion (a portion surrounded by a broken line) have a higher impurity concentration than those of the other portions to reduce electrical resistance. The active region AA1 is located apart from the active region AA2 in the Y direction.

Figure 7B:
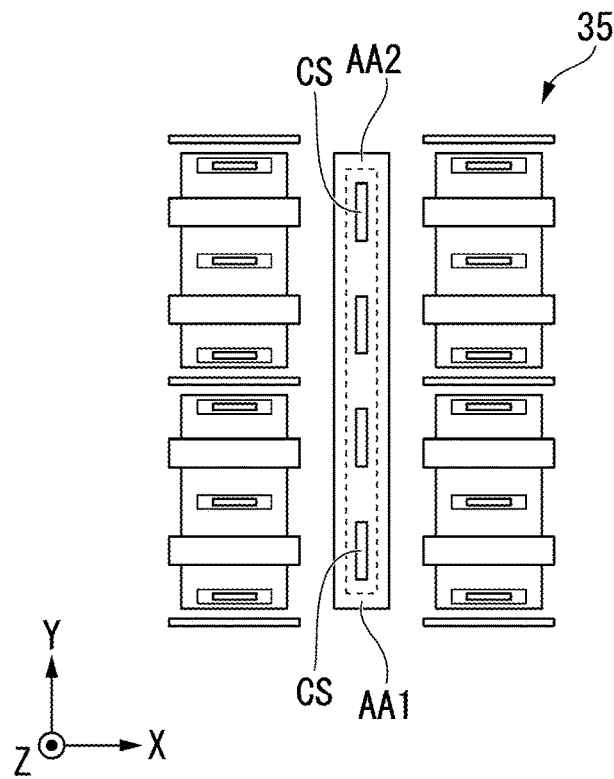
FIG. 7B is a diagram showing a modified example of the active region.

FIG. 7B is a diagram showing a modified example associated with the active regions AA1 and AA2 of FIG. 7A. Although a case in which the active regions arranged in the Y direction are separated from each other has been exemplified in FIGS. 5 and 7A, the active regions may be joined to each other as shown in FIG. 7B. When the active regions are separated from each other, it is possible to minimize current leakage between the active regions. When the active regions are joined to each other, it is possible to reduce the number of wirings connected to the control circuit 24.

In the active regions AA1 and AA2, at least a portion of the semiconductor substrate 100 having a prescribed depth (a depth which is substantially the same as that of an n-type well) from the surface thereof has the same polarity (an n-type or a p-type) as that of source/drain diffusion layers of the transistor array regions on both sides adjacent in the X direction. As in this embodiment, when a p-type semiconductor substrate is used and a transistor configured to select a neighboring transistor array region is a p-type MOS transistor, the active regions AA1 and AA2 are form in an n-type well as in the p-type MOS transistor. When the transistor configured to select a neighboring transistor array region is an n-type MOS transistor, the formation of an n-type well is not required.

Although not shown in FIG. 4, the potentials of the transistor array regions A, B, C, and D and the potentials of the active regions AA1 and AA2 in the block selection circuit 23 are controlled by the control circuit (a voltage selection circuit) 24.

It is desirable that the control circuit 24 be configured so that the potentials of the transistor array regions A, B, C, and D and the potentials of the active regions AA1 and AA2 can be controlled separately. That is to say, as shown in FIG. 1, it is desirable that, in the control circuit 24, the first voltage selectors 36 connected to the transistor array regions A, B, C, and D and a second voltage selector 38 connected to the active regions AA1 and AA2 be circuits which are separate from each other and electrically isolated from each other.

The second voltage selector 38 is configured so that a voltage V applied to an active region satisfies $V_1 \leq V \leq V_2$ and preferably satisfies $V_1 < V < V_2$ when a voltage applied to one of two neighboring transistor array regions is defined as $V_1$ and a voltage applied to the other thereof is defined as $V_2$. In view of preventing a potential gradient from becoming steep between the transistor array regions, the voltage V of the active region is more preferably a voltage close to $(V_1+V_2)/2$ which is an intermediate voltage between $V_1$ and $V_2$, and most preferably $(V_1+V_2)/2$.

To be specific, voltages applied to the transistor array regions A, B, C, and D are defined as $V_A$, $V_B$, $V_C$, and $V_D$, a structure in which a voltage V applied to the active region AA1 satisfies $V_A \leq V \leq V_C$ or $V_C \leq V \leq V_A$, and preferably $V_A < V < V_C$ or $V_C < V < V_A$ is provided. Similarly, a structure in which a voltage V applied to the active region AA2 satisfies $V_B \leq V \leq V_D$ or $V_D \leq V \leq V_B$, and preferably $V_B < V < V_D$ or $V_D < V < V_B$ is provided.

Figure 8:
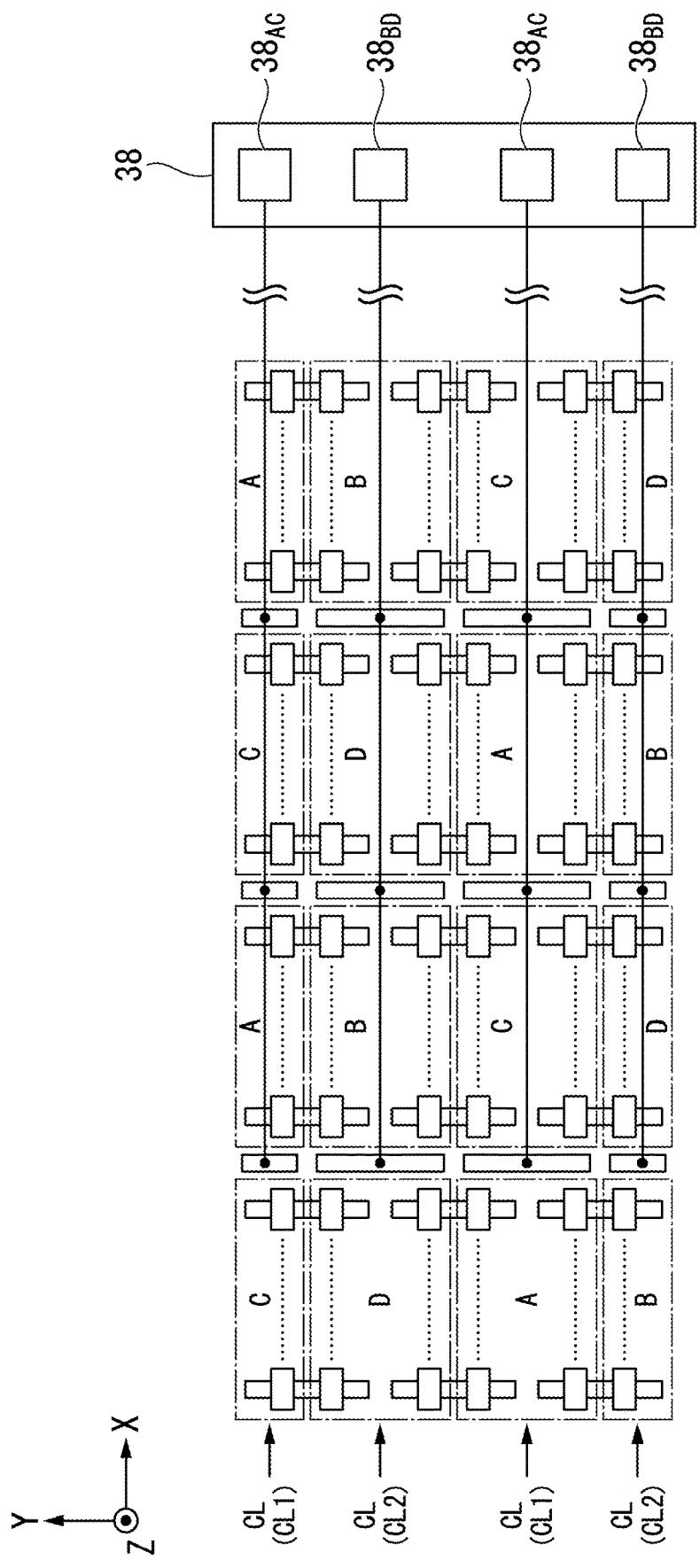
FIG. 8 is a diagram showing an example of a structure of a control circuit connected to the active region.

FIG. 8 is a diagram showing a first structure example of the second voltage selectors 38 connected to the active regions AA1 and AA2 of the block selection circuit 23. In this structure example, two transistor array regions connected to different memory blocks form a plurality of rows CL alternately arranged in one direction (the X direction) and active regions are connected to common second voltage selectors 38 for each of the rows CL. At least the same number of second voltage selectors 38 as the rows CL is provided and an active region belonging to one of the rows CL is connected to one of the second voltage selectors 38. To be specific, the two transistor array regions A and C form a plurality of (here, two) rows CL1 alternately arranged in one direction (the X direction) and are connected to separate second voltage selectors $38_{AC}$. Similarly, the two transistor array regions B and D form a plurality of (here two) rows CL2 alternately arranged in one direction and are connected to separate second voltage selectors $38_{BD}$.

Also, the plurality of active regions which are included are connected to the common second voltage selectors 38 for each of the rows CL. That is to say, the active regions are connected to different second voltage selectors 38 for each of the rows CL. In such a structure, the voltages applied to the active regions can be controlled on a column-by-column basis. Thus, it is possible to reduce the number of second voltage selectors 38 provided in the control circuit 24 as compared with a case in which an individual voltage is applied to each active region.

Figure 9:
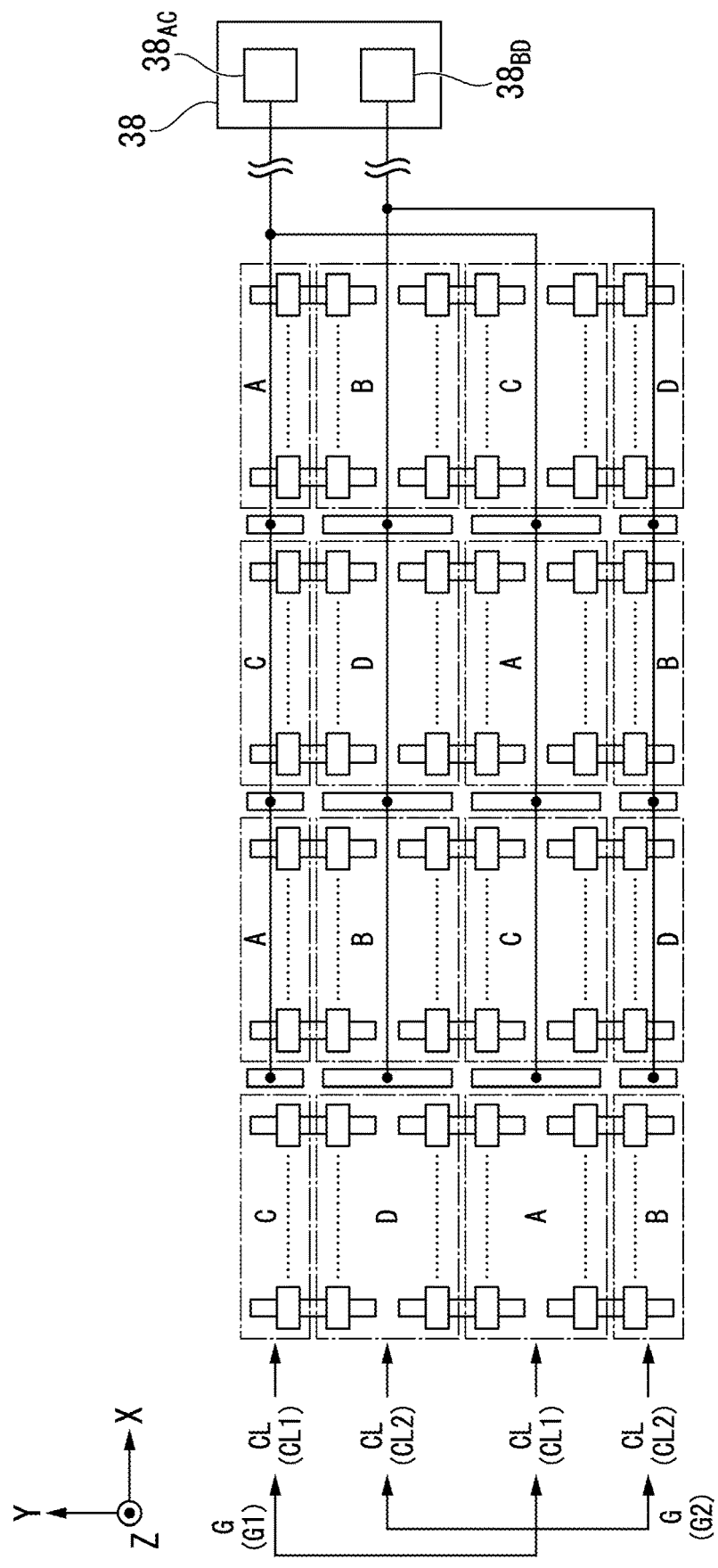
FIG. 9 is a diagram showing an example of another structure of the control circuit connected to the active region.

FIG. 9 is a diagram showing a second structure example of the second voltage selectors 38 connected to the active regions AA1 and AA2 of the block selection circuit 23. Although the same rows CL1 and CL2 as in the first structure example are formed in the second structure example, active regions are connected to common second voltage selectors 38 for each group G including a plurality of rows in which combinations of memory blocks to be connected are the same. Active regions belonging to a plurality of the rows CL are connected to one of the second voltage selector 38.

To be specific, in a group G1 having a plurality of the rows CL1 in which combinations of memory blocks to be connected are $MB_A$ and $MB_C$, an active region AA1 is connected to a common second voltage selector 38. Similarly, in a group G2 having a plurality of the rows CL2 in which combinations of memory blocks to be connected are $MB_B$ and $MB_D$, an active region AA2 is connected to a common second voltage selector 38. In such a structure, the voltages applied to the active regions can be controlled on a group-by-group basis. Thus, it is possible to reduce the number of second voltage selectors 38 provided in the control circuit 24 as compared with a case in which an individual voltage is applied to each row.

According to at least one of the embodiments described above, when the active region are provided between two neighboring transistor array regions in the block selection circuit, it is possible to apply a different voltage to the active region independently of the transistor array region.

In the semiconductor memory device, in order to reduce the number of transistors and maintain the voltage-withstanding against a write voltage and an erase voltage, design relaxations have been provided to reduce the number of transistors per block. When the design relaxations are provided, neighboring arrangements can occur due to transistor array regions having different operation timings or applied voltages. In this case, although a large potential difference occurs between neighboring transistor array regions, as described in the above embodiments, when the intermediate voltage between the voltages applied to the two transistor array regions is applied to the active regions, it is possible to minimize this potential difference and improve the voltage-withstanding.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a substrate;
   a first impurity region of a first conductive type on the substrate;
   a second impurity region of the first conductive type on the substrate, the second impurity region being apart from the first impurity region in a first direction;
   a first transistor including a first electrode on the substrate, the first transistor being disposed between the first impurity region and the second impurity region;
   a third impurity region of the first conductive type on the substrate, the third impurity region located being apart from the first impurity region in a second direction that crosses the first direction;
   a fourth impurity region of the first conductive type on the substrate, the fourth impurity region being apart from the third impurity region in the first direction;
   a second transistor including a second electrode on the substrate, the second transistor being disposed between the third impurity region and the fourth impurity region; and
   an active region of the first conductive type between the first transistor and the second transistor.

2. The semiconductor memory device according to claim 1, further comprising:
   a control circuit electrically connected to the second impurity region, the fourth impurity region, and the active region.

3. The semiconductor memory device according to claim 1, wherein the first impurity region is electrically connected to a first wiring in a first memory block and the third impurity region is electrically connected to a second wiring in a second memory block.

4. The semiconductor memory device according to claim 1, further comprising:
   a fifth impurity region of the first conductive type on the substrate, the fifth impurity region being apart from the second impurity region in the first direction; and
   a third transistor including a third electrode on the substrate, the third transistor being disposed between the second impurity region and the fifth impurity region.

5. The semiconductor memory device according to claim 4, further comprising:
   a control circuit electrically connected to the second impurity region and the active region,
   wherein the first impurity region is electrically connected to a first wiring in a first memory block and the fifth impurity region is electrically connected to a third wiring in a third memory block.

6. The semiconductor memory device according to claim 4, further comprising:
   a sixth impurity region of the first conductive type on the substrate, the sixth impurity region being apart from the fourth impurity region in the first direction; and
   a fourth transistor including a fourth electrode on the substrate, the fourth transistor being disposed between the fourth impurity region and the sixth impurity region.

7. The semiconductor memory device according to claim 6, further comprising:
   a control circuit electrically connected to the second impurity region, the fourth impurity region, and the active region,
   wherein the first impurity region is electrically connected to a first wiring in the first memory block,
   the third impurity region is electrically connected to a second wiring in a second memory block,
   the fifth impurity region is electrically connected to a third wiring in a third memory block, and
   the sixth impurity region is electrically connected to a fourth wiring in a fourth memory block.

8. The semiconductor memory device according to claim 1, wherein the active region has a profile of an impurity concentration of the first conductive-type where the impurity concentration increases as a position becomes closer to a surface of the substrate.

9. A semiconductor memory device, comprising:
   a block selection circuit; and
   a control circuit,
   wherein the block selection circuit comprises:
   a plurality of transistor array regions having an array of a plurality of selection MOS transistors connected to a plurality of memory blocks, and
   an active region between two adjacent transistor array regions of the plurality of transistor array regions; and
   wherein the control circuit is configured to control potentials of the plurality of transistor array regions and a potential of the active region,
   wherein the active region has a contact that is connected to the control circuit, at least the contact has the same polarity as diffusion layers of the plurality of selection MOS transistors.

10. The semiconductor memory device according to claim 9,
    wherein the control circuit comprises a plurality of first voltage selectors that are connected to the plurality of transistor array regions, and a plurality of second voltage selectors that are connected to the active region, and
    wherein the plurality of first voltage selectors and the plurality of second voltage selectors are electrically isolated from each other.

11. The semiconductor memory device according to claim 10,
    wherein the plurality of transistor array regions comprises a plurality of first columns, each first column comprises an alternating alignment of transistor array regions of a first group connected to a first memory block of the plurality of memory blocks and transistor array regions of a second group connected to a second memory block of the plurality of memory blocks, and
    the plurality of first columns are connected to the plurality of second voltage selectors that are connected to the active region.

12. The semiconductor memory device according to claim 9,
    wherein the control circuit comprises a first voltage selector that is connected to the plurality of transistor array regions, and a second voltage selector that is connected to the active region, and wherein the first voltage selector and the second voltage selector are electrically isolated from each other.

13. The semiconductor memory device according to claim 12, wherein the plurality of transistor array regions comprises a plurality of first columns, each first column comprises an alternating alignment of transistor array regions of a first group connected to a first memory block of the plurality of memory blocks and transistor array regions of a second group connected to a second memory block of the plurality of memory blocks, and the plurality of first columns are connected to the second voltage selector that is connected to the active region.

* * * * *